United States Patent [19]

Leeson

[11] 3,755,758

[45] Aug. 28, 1973

[54] DIGITAL TUNED MICROWAVE OSCILLATOR

[75] Inventor: David B. Leeson, Los Altos, Calif.

[73] Assignee: California Microwave, Inc., Sunnyvale, Calif.

[22] Filed: Oct. 4, 1971

[21] Appl. No.: 186,526

Related U.S. Application Data

[63] Continuation of Ser. No. 868,720, Oct. 23, 1969, abandoned.

[52] U.S. Cl. .............. 331/101, 331/117 D, 331/179, 333/81 A, 334/15

[51] Int. Cl. .............. H03b 5/18

[58] Field of Search .............. 331/96, 101, 102, 331/117 D, 179; 333/73 C, 81 A, 81 B, 98, 99 S; 334/15

[56] References Cited

UNITED STATES PATENTS

| | | | |
|---|---|---|---|
| 3,319,187 | 5/1967 | Crandall | 331/117 |
| 3,349,350 | 10/1967 | Rittenbach | 334/47 |
| 3,417,351 | 12/1968 | DiPiazza | 333/73 |
| 3,518,586 | 6/1970 | Nilssen et al. | 331/179 |
| 3,538,450 | 11/1970 | Andrea et al. | 331/10 |

OTHER PUBLICATIONS

Electronics, King et al., Mar. 1954 pages 184–186.

*Primary Examiner*—John Kominski
*Attorney*—Claude A. S. Hamrick et al.

[57] ABSTRACT

A high stability digitally tuned L-band cavity oscillator employs PIN diode switching of the cavity resonant frequency to provide an output signal at any one of 16 discrete frequencies under the control of a four-wire digital input. An analog input is added to adjust the centerline frequency over a bandwidth at least as wide as the least significant incremental step to further provide for AFC and phase lock capability. A half-wave resonator cavity is used with a quarter-wave member notched at intervals along its length. A switching diode adapted to be coupled to a source of digital signals is coupled across each notch to digitally control the electrical characteristics of the resonator and its output frequency. A varactor provides the analog and fine tuning control.

6 Claims, 5 Drawing Figures

INVENTOR.
David B. Leeson

BY

J. Rosenblum
& Warren M. Becker
ATTORNEYS

DIGITAL TUNED MICROWAVE OSCILLATOR

This application is a continuation of my previously filed application Ser. No. 868,720 entitled "Digital Tuned Microwave Oscillator" and filed in the United States Patent Office on Oct. 23, 1969 now abandoned.

BACKGROUND OF THE INVENTION

Microwave oscillators closely related to the present invention fall within two broad categories, mechanically tuned single frequency oscillators and wideband analog tuned oscillators. The mechanically turned oscillators have exhibited excellent operating characteristics over their designed range of operation though at the expense of practical analog tuning control. The analog tuned oscillators, such as the Varactor and YIG tuned oscillators, while providing for wideband analog tuning control, have exhibited reduced resonator Q under wide range non-linear tuning, temperature instability requiring an oven or thermal blankets, discontinuities due to unwanted modes, extreme sensitivity to noise on the control line and the need for a digital to analog converter and breakpoint linearizer for digital control.

SUMMARY OF THE INVENTION

A principal object of the present invention is a digitally and analog controllable microwave oscillator which preserves and combines the desirable characteristics of a single frequency mechanically tuned oscillator with narrowband analog voltage tuning. The oscillator of the present invention permits direct interface with digital control signals without requiring an intermediate digital to analog converter or breakpoint linearizer, it is relatively insensitive to control line noise and exhibits thermal stability over a wide range of temperatures.

In accordance with the above objects, there is provided a digitally and analog controllable microwave oscillator for generating microwave signals in a desired frequency band which may be multiplied to provide signals of corresponding frequencies in any of several higher frequency bands. A conventional transistor circuit is coupled to a half-wave length high-Q cavity resonator. Low-loss PIN switching diodes are placed at selected points along a quarter-wave length of the cavity. By controlling the diodes with externally applied digital signals in a geometric fashion, narrowband output signals at any one of 16 discrete geometrically proportional frequencies may be obtained.

For reasons not yet clearly understood, a resonant cavity of bandwidth, for example, 1250 to 1282 mc, made in accordance with the present invention can be controlled to provide output signals at discrete steps of 2 mc, 4 mc, 8 mc, 16 mc or any combination of these steps over the entire bandwidth of the cavity.

A principal feature of the present invention is a voltage controllable capacitance, such as a varactor, that is coupled into the cavity to further provide narrowband, as of 2 mc, analog tuning for AFC or phase lock control over the entire band width of the cavity.

These and other objects, features and advantages of the present invention will become apparent in the following detailed description and accompanying drawings in which.

DETAILED DESCRIPTION OF THE INVENTION

Figure 1:
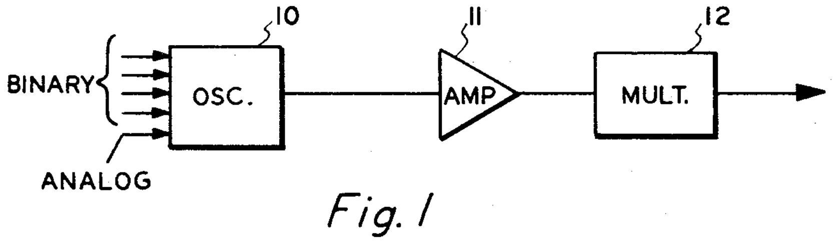
FIG. 1 is a block diagram of a microwave oscillator of the present invention in a typical circuit.

In FIG. 1, an oscillator 10 made in accordance with the present invention is coupled to an amplifier 11 and a multiplier 12 to provide narrowband output signals is any one of several higher frequency bands. In typical applications, oscillator 10 operates in the L-band (1–2ghz), amplifier 11 is an L-band transistor power amplifier providing power amplification and isolation and multiplier 12 incorporates step-recovery diodes and 600 Mhz comb-line filters of conventional configuration to provide an output in either the C or X band. The output frequency of oscillator 10 is controlled in the typical embodiment herein described by a four-wire binary input and a single analog input. In a well known manner, dc potential levels are applied to the binary input lines of oscillator 10 to provide four levels of control and hence an output signal at any one of 16 discrete geometrically proportioned frequencies. With, for example, an L-band oscillator having a bandwidth of 1250 – 1282 mc, it is possible with the present invention to obtain an output signal at 2 mc intervals over the entire bandwidth of the oscillator. That is to say, frequency steps of 2 mc, 4 mc, 8 mc, 16 mc and any combination of these steps are available. Also in a well known manner, a continuously variable dc or analog voltage level is applied to the analog input of oscillator 10 for providing analog control of the frequency of the output signal. With the present invention, the analog control may be restricted to narrowband tuning as, for example, 2 mc to avoid the disadvantages of wideband analog tuning while yet providing for continuous frequency control, AFC and phase locking over the entire bandwidth of the oscillator.

Figure 2:
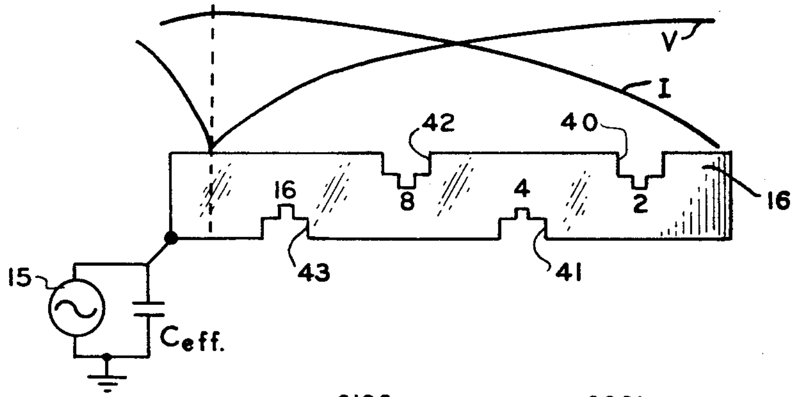
FIG. 2 is a partial schematic and plan view of a quarterwave length section of the resonator of the present invention with typical voltage and currents distribution curves.
Figures 3, 4, 5:
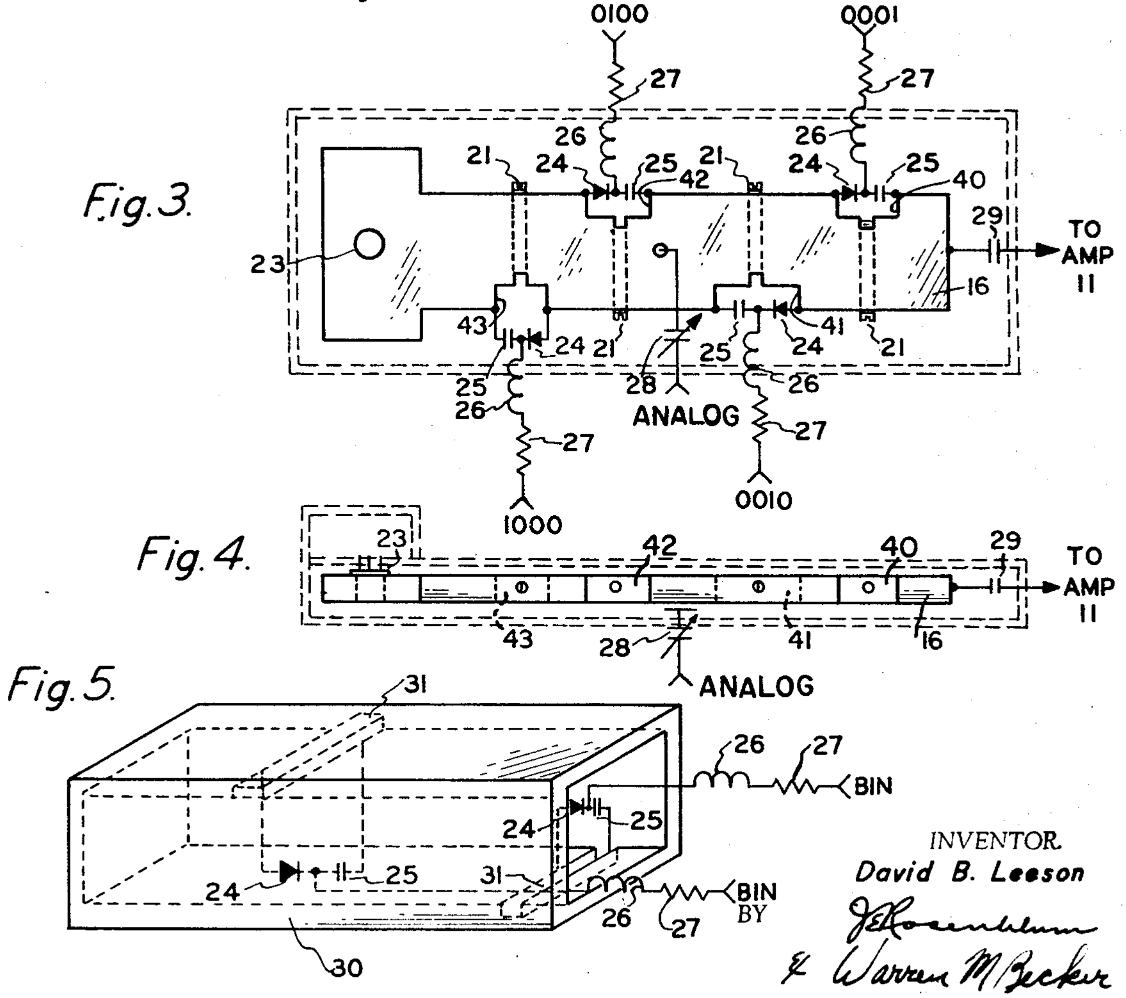
FIG. 3 is a partial schematic and plan view of the resonator of the present invention.
FIG. 4 is a top view of the resonator shown in FIG. 3.
FIG. 5 is a partial schematic and perspective view of an alternative embodiment incorporating the present invention.

Referring to FIGS. 2–4, there is provided the electrical equivalent of an open-ended half-wave resonant coaxial cavity with the external conductor and housing for other electronics shown in dashed lines for clarity comprising a conventional signal source 15 together with its equivalent internal capacitance $C_{eff}$ coupled to a quarter-wave length elongated member 16. Since frequency control is restricted to the quarter-wave length section coupled to the output, advantage may be taken of the internal inductance, capacitance and resistance of signal source 15 to foreshorten, as depicted, the physical longitudinal dimension of the oscillator in general and the coaxial cavity in particular. The foreshortening results in a significant reduction in size and weight. It is understood, however, that a quarter-wave length cavity may also be used when appropriate.

Elongated member 16 which serves as a central conductor in a coaxial cavity is made of a relatively thin conductive material substantially rectangular in cross-section. For purposes of temperature stability, the material, such as Invar, should exhibit a low coefficient of thermal expansion. Alternatively, member 16 is made from a member of circular cross-section, such as a rod or tube. Notches 40–43 are cut into member 16 at selected points along its longitudinal dimension.

As discussed in more detail hereinafter, the effectiveness of a notch is proportional to the amount of current in the vicinity of the notch. The size, shape and position of the notch affects the current distribution along member 16 and determines the size of the frequency step by determining the electrical length of the resonator with and without an electrical short across the notch.

In practice, the choice of size and geometrical shape of each of notches 40–43, the distance between adjacent pairs of notches and the distance of each notch from an arbitrary datum line on member 16, such as the right end, are all a matter of design choice and are systematically adjusted to provide the degree of digital frequency control and discrete changes in frequency desired for a particular application. By changing any one or a combination of these factors, a predetermined magnitude of frequency change for each step may be obtained. Conversely, a particular frequency change may be obtained with various arrangements of these factors. Ideally, all steps are independent of each other and are graduated to correspond with the significance of the control bit.

Because of the freedom to pick and choose notch shape, size and position, it is found most convenient to pick a size, shape and position for the notches for ease of manufacturing and machining. To obtain frequency changes in 2 mc steps, in a geometric fashion such as 2 mc, 4 mc, 8 mc, 16 mc, or any combination of these, notches 40–43 are therefore conveniently provided to be substantially identical in size and geometrical shape, equally spaced from the ends and along member 16, and preferable alternately disposed on opposing edges of member 16. Putting the notches on opposite sides of member 16 reduces interaction between notches. The distance between each of the notches and the distance of notches 40 from the end of member 16 are also approximately equal as illustrated in FIG. 2. The member 16 is further tapped and threaded in the vicinity of each of the notches 40–43 to receive a screw 21 which provides a degree of mechanical tuning control. As shown in FIG. 3 and 4, the active element, a transistor 23, of signal source 15 (the remainder of source 15 is omitted for clarity) is coupled via the transistor cover or can which serves as the collector in a conventional manner to member 16. Member 16 is enlarged in the vicinity of transistor 23 and in cooperation with the internal inductance, capacitance, and resistance, source 15 serves to permit foreshortening of member 16 as previously described.

To provide digital frequency control, a PIN diode 24 is connected in series to a blocking capacitor 25 across the open end of each of notches 40–43. A choke 26 and resistor 27 are connected in series between diode 24 and capacitor 25 and the dc voltage level inputs indicated generally as binary levels. A voltage controllable capacitance, such as a varactor 28, is coupled to member 16 at any appropriate point as is well known, and the output signal is provided through an output capacitor 29. Varactor 28 is adapted to receive a continuously variable dc voltage for providing continuous frequency control over a desired narrowband as, for example, 2 mc.

Referring to FIG. 5, there is shown an alternative arrangement wherein the present invention may be incorporated in a conventional rectangular half-wave cavity 30. Saw-cuts 31 are made in the walls of cavity 30 transverse the longitudinal dimension at selected spaced apart points. A diode 24, capacitor 25, choke 26 and resistor 27 are coupled across each of saw-cuts 31 in the same manner as across notches 40–42 described with respect to FIGS. 2–4.

It is known that the magnitude of the current I is a minimum and the voltage V a maximum at the end of an open-ended half-wave length line and that the reverse is true at the electrically equivalent center of the line as is shown in FIG. 2. The current distribution roughly represents a cosine curve between these points. In practice it has been found that the output or resonant frequency of the cavity is closely related to the magnitude of current along the line. The notches disturb and lengthen the current path near each of the notches and are believed to increase the inductance of the line without significantly affecting its capacitance to a greater degree near the midpoint of the line near transistor 23 than near the end of the line near output capacitor 29. Shorting any one of diodes 24 has the effect of reducing the inductance and raising the resonant frequency of the cavity. Shorting each of diodes 24 across notches 40–43 individually and sequentially in turn restuls in an increase in resonant frequency in a geometric fashion. That is, shorting diode 24 across notch 40 results in a 2 mc change in resonant frequency. Shorting diode 24 across notch 41 results in a 4 mc change in resonant frequency, while shorting diode 24 across both notches 40 and 41 simultaneously, results in a 6 mc change in resonant frequency. Referring to FIG. 3, binary inputs 0001, 0010, 0100 and 1000, represent the order in which discrete frequency changes in 2 mc steps, in a geometric fashion, or in any combination of these, may be obtained by the selective application of signals to one or more of diodes 24 across notches 40–43, respectively.

The following table sets forth the frequency changes obtained by the singular and combinatorial application of diode shorting signals to binary inputs 0001, 0010, 0100, 1000.

| INPUT | FREQUENCY CHANGE |
|---|---|
| 0000 | 0 mc |
| 0001 | 2 mc |
| 0010 | 4 mc |
| 0011 | 6 mc |
| 0100 | 8 mc |
| 0101 | 10 mc |
| 0110 | 12 mc |
| 0111 | 14 mc |
| 1000 | 16 mc |
| 1001 | 18 mc |
| 1010 | 20 mc |
| 1011 | 22 mc |
| 1100 | 24 mc |
| 1101 | 26 mc |
| 1110 | 28 mc |
| 1111 | 30 mc |

As shown in the table, the application of diode shorting signals to input 0001 and 0010 results in a change which is the sum of the change obtained from the application of the signal to each of the diodes separately, or 6 mc. For convenience this is shown as the binary sum 0001 and 0010 which equals 0011. Similarly, the application of a diode shorting signal to the diodes across notches 40, 41 and 43, will result in a change in frequency of 14 mc as represented by the binary sum of 0001, 0010 and 0100 or 0111. Accordingly, it is understood that a change in the least significant bit results in a 2 mc change in frequency and a change in the next more significant bit results in a 4 mc change in frequency and so on. It has been further observed that each of diodes 24 may be switched independently in any order or in any combination without affecting the frequency response due to the switching of a corresponding one of diodes 24.

The rapid return of the current once past a notch to normal, that is, equally distributed over the cross-section of member 16, is believed to account for the independent effect each of diodes 24 have on the resonant frequency. It follows, therefrom, that more or less diodes 24 may be used as is desired.

I claim:

1. A microwave oscillator comprising: a frequency-determining microwave-resonant electrically conductive member for conducting current at the output oscillation frequency; a first frequency control means coupled in parallel with a first portion of said member and selectively operable for shunting a portion of said current past said first portion of said member for providing a first discrete change in said output frequency; a second frequency control means coupled in parallel with a second portion of said electrically-conductive member and selectively operable for shunting a portion of said current past said second portion of said member for providing a second discrete change in said output frequency the magnitude of which is substantially independent of the operation of said first frequency control means; and means for applying control signals to said first and said second frequency control means for selectively operating said first and said second frequency control means separately and in combination for selectively providing said first discrete change in said output frequency when only said first frequency control means is operated, said second discrete change in said output frequency when only said second frequency control means is operated and a third discrete change in said output frequency which is substantially equal to the sum of said first and said second discrete changes in said output frequency when both said first and said second frequency control means aare operated simultaneously.

2. A microwave oscillator according to claim 1 further comprising means coupled to said electrically conductive member for adjusting the output frequency of said oscillator continuously over a predetermined range.

3. A microwave oscillator according to claim 2 wherein said adjusting means comprises voltage controlled variable capacitive means.

4. A microwave oscillator according to claim 3 wherein said electrically conductive member is effectively one quarter-wave length long.

5. A microwave oscillator according to claim 1 wherein said first and second portions of said conductive member each have a notch formed therein and wherein said first and second frequency control means comprises a first binary element and a second binary element respectively coupled across said notches.

6. A microwave oscillator according to claim 1 further comprising a first reactive circuit element coupled in series with a first diode and a second reactive circuit element coupled in series with a second diode and wherein said control signal applying means is coupled between said first diode and said first capacitor and between said second diode and said second capacitor for selectively switching said first and said second diodes.

* * * * *